(12) United States Patent
Escher-Poeppel et al.

(10) Patent No.: US 9,355,984 B2
(45) Date of Patent: May 31, 2016

(54) ELECTRONIC DEVICE AND METHOD FOR FABRICATING AN ELECTRONIC DEVICE

(71) Applicant: Infineon Technologies AG, Neubiberg (DE)

(72) Inventors: Irmgard Escher-Poeppel, Deggendorf (DE); Eduard Knauer, Regensburg (DE); Thomas Kunstmann, Laaber (DE); Peter Scherl, Regensburg (DE); Raimund Foerg, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 13/944,927

(22) Filed: Jul. 18, 2013

(65) Prior Publication Data
US 2015/0021792 A1    Jan. 22, 2015

(51) Int. Cl.
*H01L 23/00* (2006.01)
*H01L 23/373* (2006.01)

(52) U.S. Cl.
CPC ............ *H01L 24/29* (2013.01); *H01L 23/3736* (2013.01); *H01L 24/27* (2013.01); *H01L 24/743* (2013.01); *H01L 24/83* (2013.01); *H01L 24/94* (2013.01); *H01L 2224/27332* (2013.01); *H01L 2224/27848* (2013.01); *H01L 2224/29247* (2013.01); *H01L 2224/29647* (2013.01); *H01L 2224/32145* (2013.01); *H01L 2224/32245* (2013.01); *H01L 2224/83011* (2013.01); *H01L 2224/83065* (2013.01); *H01L 2224/8384* (2013.01); *H01L 2224/83193* (2013.01); *H01L 2224/83203* (2013.01); *H01L 2224/85547* (2013.01); *H01L 2924/10253* (2013.01); *H01L 2924/10271* (2013.01); *H01L 2924/10272* (2013.01); *H01L 2924/10329* (2013.01); *H01L 2924/12042* (2013.01); *H01L 2924/15747* (2013.01); *H01L 2924/181* (2013.01)

(58) Field of Classification Search
CPC ................. H01L 2924/01079; H01L 2924/14; H01L 2924/01013; H01L 2924/01029; H01L 2224/48091
USPC .......................................................... 257/784
See application file for complete search history.

(56) References Cited

U.S. PATENT DOCUMENTS

| | | | |
|---|---|---|---|
| 2008/0283579 A1* | 11/2008 | Gunturi et al. | 228/121 |
| 2010/0227421 A1* | 9/2010 | Neff et al. | 438/26 |
| 2011/0071635 A1* | 3/2011 | Zhang et al. | 623/17.11 |
| 2013/0001803 A1* | 1/2013 | Mengel et al. | 257/782 |
| 2015/0031203 A1* | 1/2015 | Krenzer et al. | 438/669 |

\* cited by examiner

*Primary Examiner* — Allen Parker
*Assistant Examiner* — Long Le
(74) *Attorney, Agent, or Firm* — Murphy, Bilak & Homiller, PLLC

(57) ABSTRACT

An embodiment method for fabricating electronic devices having two components connected by a metal layer includes applying a metal layer to each component and connecting the metal layers such that a single metal layer is formed.

5 Claims, 5 Drawing Sheets

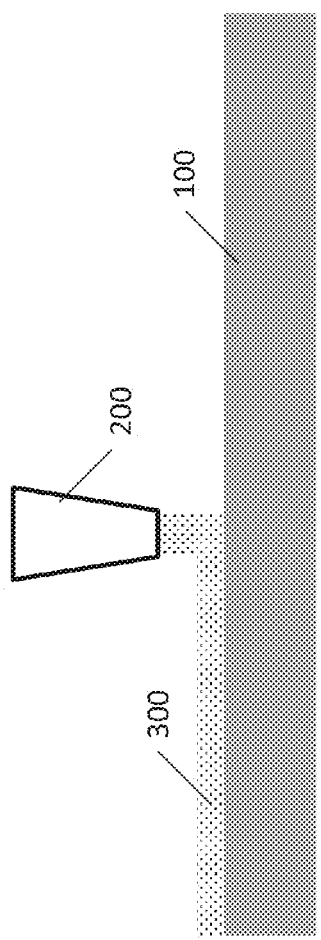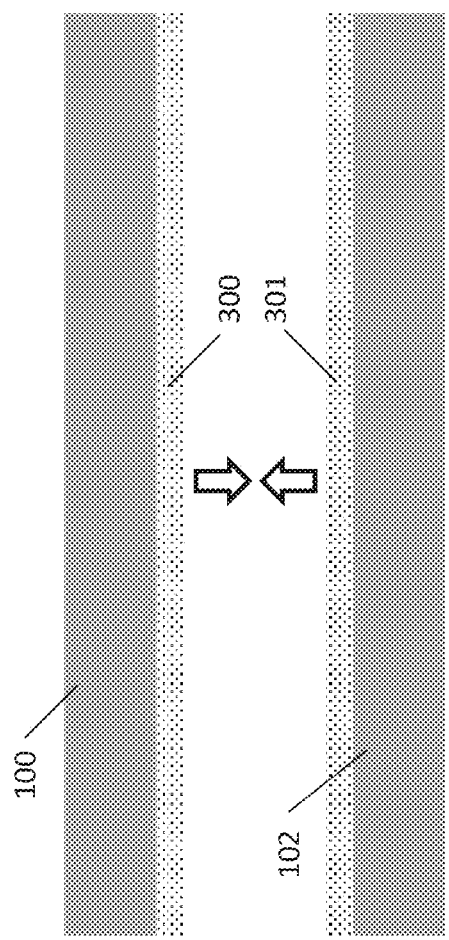

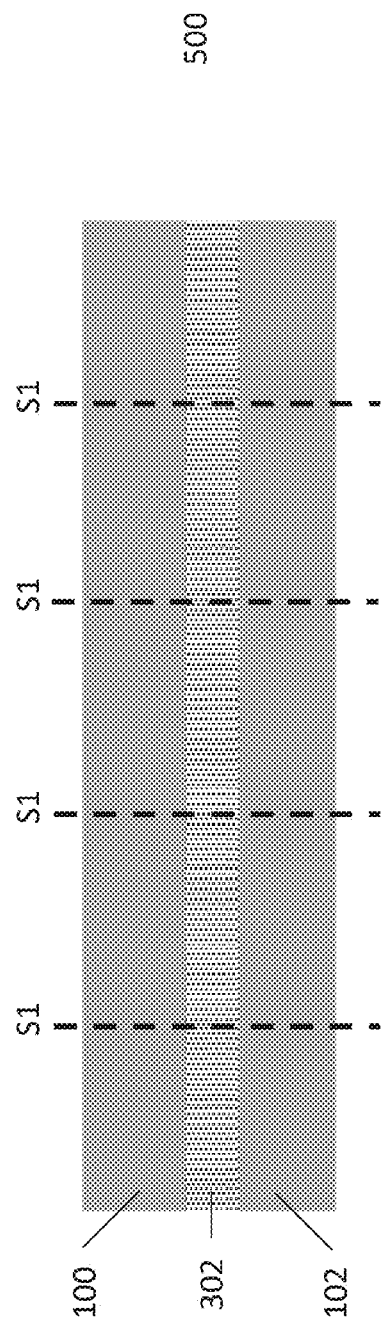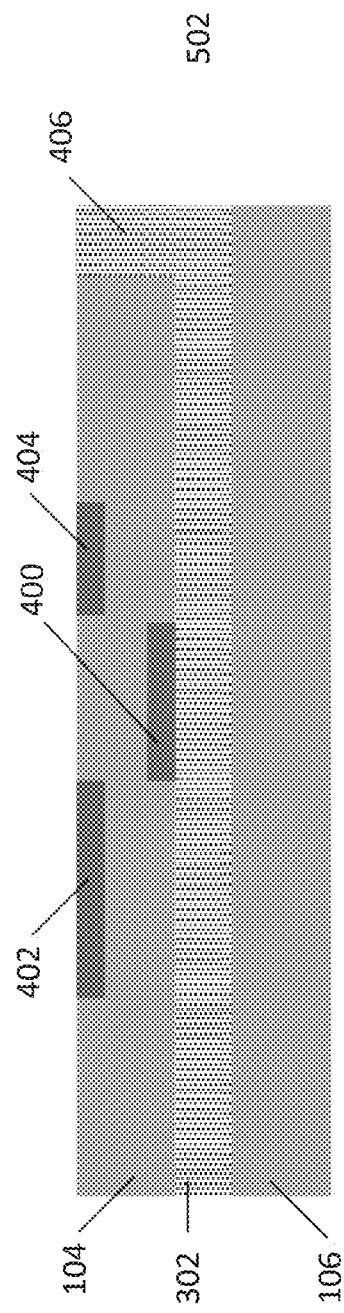

ELECTRONIC DEVICE AND METHOD FOR FABRICATING AN ELECTRONIC DEVICE

TECHNICAL FIELD

The present invention relates to an electronic device and a method for fabricating electronic devices.

BACKGROUND

Electronic devices may comprise semiconductor chips which may be connected to further parts of the electronic device via a metal layer. The metal layer may, among else, function as a heat conductor and may cover a large surface area of the semiconductor chip. The semiconductor material and the metal may have different heat extension coefficients which may for example lead to mechanical tension, delamination and failure of the electronic device.

For these and other reasons, there is a need for the present invention.

SUMMARY

According to an embodiment of an electronic device, the electronic device comprises a semiconductor device having a main surface, a substrate having a main surface, a first porous metal layer on the main surface of the semiconductor device, and a second porous metal layer on the main surface of the substrate. The first porous metal layer and the second porous metal layer are arranged such that a form-fitting connection between the porous metal layers is formed.

According to another embodiment of an electronic device, the electronic device comprises a first component, a second component, and a porous metal layer. The metal porous layer is disposed between and electrically connects the first and second components. A porosity of the porous metal layer is in a range of 5% to 50%.

According to an embodiment of a method for fabricating an electronic device, the method comprises: fabricating a first porous metal layer on a main surface of a first electronic element; fabricating a second porous metal layer on a main surface of a second electronic element; arranging the first electronic element and the second electronic element such that the first porous metal layer and the second porous metal layer are aligned face to face; and applying heat and pressure such that both porous metal layers are form-fittingly connected.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1, which comprises FIGS. 1A-1C, depicts a cross-sectional view of various states of fabrication of an electronic device.

FIG. 2, which comprises FIGS. 2A-2C, depicts a cross-sectional view of various embodiments of an electronic device comprising two components and a metal layer connecting the two components.

DETAILED DESCRIPTION

Figure 2B:
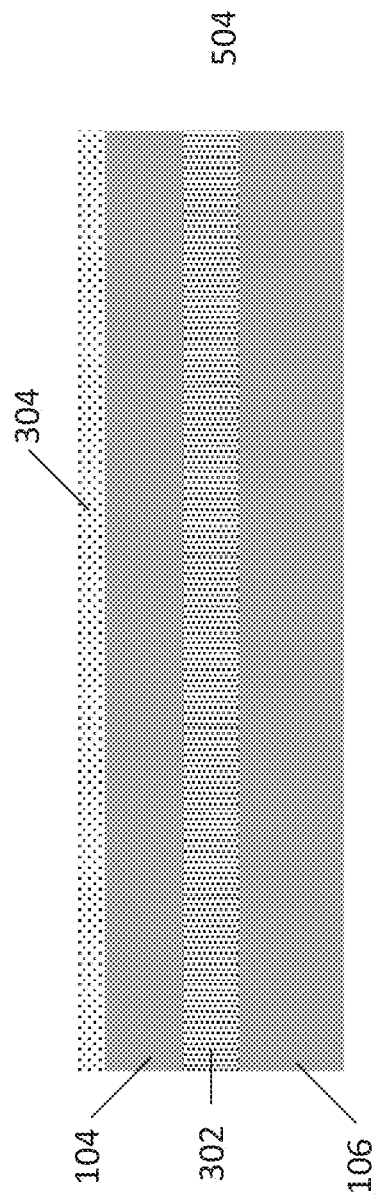

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof, and in which is shown by way of illustration specific embodiments in which the invention may be practiced. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top", "bottom", "left", "right", "upper", "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense, and the scope of the present invention is defined by the appended claims.

The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

The semiconductor chips considered herein may be thin. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The devices described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

In the following description and claims different embodiments of a method for fabricating a chip module are described as a particular sequence of processes or measures, in particular in a flow diagram. It is to be noted that the embodiments should not be limited to the particular sequence described. Particular ones or all of different processes or measures can also be conducted simultaneously or in any other useful and appropriate sequence.

A metal layer may be applied to at least one surface of a semiconductor chip or a wafer comprising multiple semiconductor chips. The metal layer may function as an electric contact for contacting the semiconductor chip. In one embodiment the metal layer may among else function as a heat conductor. In one embodiment the metal layer may comprise copper. Copper possesses excellent electric and heat conducting properties. The metal layer may cover a large surface area of the wafer.

Via the metal layer the semiconductor chip may be connected to further electronic elements to form an electronic device.

In the following in connection with FIG. 1 various stages of a fabrication process of an electronic device are shown.

FIG. 1A is a cross-sectional view of an electronic element 100. A dispenser unit 200 may be used for dispensing metal microparticles to form a metal layer 300 above the electronic element 100. The dispenser unit 200 may be moved laterally over the electronic element 100 or the electronic element 100 may be positioned on a movable stage for laterally moving it under the dispenser unit 200.

In one embodiment the electronic element 100 may comprise a semiconductor chip or a semiconductor wafer comprising multiple semiconductor chips. In another embodiment the electronic element 100 may comprise an eWLB-wafer (embedded Wafer Level Ball grid array wafer). The eWLB-wafer may comprise integrated multi-chips. The eWLB-wafer may further comprise copper vias and/or a mold compound. The mold compound may be compatible with high temperatures. In another embodiment the electronic element 100 may comprise a laminated module comprising electric contact pads. In another embodiment the electronic element 100 may comprise a lead frame or a metal block. The metal block may comprise copper or a mixture of copper and carbon. Such a mixture may be beneficial because it may exhibit a lower heat extension coefficient than pure copper. The metal block may function as a heat sink for a power semiconductor.

The dispenser unit 200 may comprise a plasma dispenser. The plasma dispenser may dispense a jet of cold working plasma which may further comprise metal microparticles in powder form. The working plasma may comprise air or nitrogen or argon or another suitable gas. The plasma gas may further comprise additives like, for example, hydrogen and/or oxygen. The microparticles may have a size of 0.1 µm to 20 µm and may be continuously fed to the plasma jet. Through the plasma jet the metal microparticles may be transferred to an exposed surface of the substrate 100 where they may adhere and form the metal layer 300. Microparticles being transferred by the plasma jet of a cold working plasma may exhibit a lower velocity compared to other techniques such as plasma spraying or cold gas spraying.

In another embodiment the metal layer 300 may be fabricated using other suitable techniques like, for example, jet dispersion or flame spraying.

The metal layer 300 may exhibit a thickness of 1 µm to 200 µm. The metal layer 300 may be porous and the volume of the pores may comprise 10% to 60% of the total volume of the metal layer 300. The pores may be evenly distributed throughout the metal layer 300. Such even distribution may improve the elasticity of the metal layer 300 and may reduce mechanical tension.

The metal microparticles forming the metal layer 300 may be firmly bonded and may form large scale contiguous areas. The metal may be copper and the electrical and thermal properties of such a porous copper layer may be almost as good as those of a copper block.

Fabricating a metal layer using cold plasma assisted deposition of microparticles may not require alloy additions like, for example, AuSn or SnAg or additions of a flux melting agent which may be necessary when using other methods for fabricating such metal layers but may degrade the electrical, thermal or mechanical properties of the metal layer 300. Furthermore, cold plasma assisted deposition of microparticles does not entail using organic substances that need to be cleaned off later.

Fabricating a metal layer using cold plasma assisted deposition of microparticles does not require applying interconnection lead between the electronic element and the metal layer. Interconnection lead may degrade the thermal and electrical properties of the interconnection and may exhibit only small power cycle stability.

Connecting a metal block to an electronic element using soldering under high temperature and high pressure may require temperatures above 300° C. and may lead to mechanical tension. A metal layer fabricated using cold plasma assisted deposition of microparticles may lead to less mechanical tension on the substrate. The strength of the tension may depend on the porosity of the metal layer. The porosity may be tunable through the employed temperature and/or pressure during the cold plasma assisted deposition of microparticles.

Sinter paste as an interlayer between a metal block and an electronic element may exhibit poor thermal and electrical conduction properties. Copper bonding is performed at high pressures and requires a proper substrate to avoid chip cracks. Copper bonding may cause parasitic capacities and is limited in the possible designs.

FIG. 1B shows how two electronic elements 100, 102 comprising metal layers 300, 301 may be connected to fabricate an electronic device or a multitude of not yet singulated electronic devices. The electronic elements 100, 102 may be arranged such that the metal layers 300, 301 are aligned face to face. Heat and pressure may be applied to the electronic elements 100, 102 to form-fittingly connect the metal layers 300, 301 in a sintering step. The porous structure of the metal layers 300, 301 may help in fabricating such a form-fitting connection. In particular, a smooth surface of the metal layers 300, 301 may be detrimental for the sintering step as it may prevent a sufficient binding of the two metal layers 300, 301.

The surface of the metal layers 300, 301 may comprise a copper oxide layer which may prevent diffusion of copper atomic cores between the metal layers 300, 301 when the metal layers 300, 301 are brought into contact. The copper oxide layer may be removed completely or at least in part by using a cleaning step with MSA (methanesulfonic acid). Applying pressure as described above may help to break the copper oxide layer and allow diffusion of copper atomic cores. Alternatively, a forming gas comprising hydrogen may be used during sintering. In this case the hydrogen may reduce the copper oxide layer and diffusion of copper atomic cores may be facilitated. In this case the necessary pressure in the sintering step may be lower than without using forming gas.

The electronic element 102 may, for example, comprise a laminated module or a lead frame or a semiconductor wafer. The electronic element may comprise an electric via connecting the metal layer 301 with the opposite side of the electronic element 102. In another embodiment the electronic element 102 may comprise a copper block.

1C shows the resulting structure 500 of connecting the two electronic elements 100, 102 by applying heat and pressure as described above. The two distinct metal layers 300, 301 of FIG. 1B are form-fittingly connected and form a single metal layer 302.

The temperature of the heat application process may be 100° C. to 400° C., in particular about 200° C. The pressure in the pressure application process may be 2 Mpa to 300 Mpa. The respective heat and pressure applied may affect the fabric of the single metal layer 302. In particular, varying the heat and/or pressure applied may result in a different porosity of the single metal layer 302. The volume of the pores in the single metal layer 302 may comprise 5% to 50%, in particular 20% to 30% of the total volume of the single metal layer 302. The relative volume of the pores of the single metal layer 302 may be smaller than the relative volume of the pores in the initial metal layers 300, 301.

As mentioned above the electronic elements 100, 102 may comprise multiple chips. The electronic elements 100, 102 and the connecting metal layer 302 may be separated into individual electronic devices by sawing along predefined sawing streets S1. Sawing may for example be performed using a laser or a mechanical saw or a chemical etching process or an appropriate combination of these processes.

FIG. 2A shows an embodiment of an electronic device 502, wherein the electronic device 502 comprises a first component 104, a second component 106 and a metal layer 302. For example, the first component 104 may comprise at least one electrode 400 in contact with the metal layer 302 and further electrodes 402, 404 not in contact with the metal layer 302. The first component 104 may further comprise an electrically conductive via 406 connecting the metal layer 302 to the side of the first component 104 where the electrodes 402, 404 are located. The electrically conductive via 406 may be fabricated in the same step as the metal layer 302. In particular, the electrically conductive via 406 may be fabricated using cold plasma assisted deposition of microparticles.

FIG. 2B shows an embodiment of an electronic device 504, wherein the electronic device 504 comprises a first component 104, a second component 106, a first porous metal layer 302, and a second porous metal layer 304. The first component 104 and the second component 106 may comprise electrodes or electrically conductive vias which are not depicted for ease of illustration. The metal layers 302, 304 may comprise predefined structures.

Figure 2C:
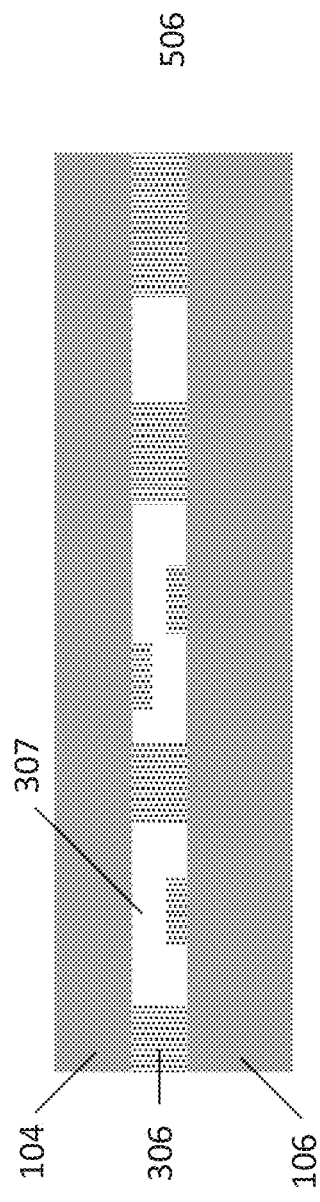

FIG. 2C shows an embodiment of an electronic device 506, wherein the electronic device 506 comprises a first component 104, a second component 106, and a porous metal layer 306. The porous metal layer 306 may comprise predefined structures, for example for creating individual electric contacts. A dielectric 307 may be used to isolate the electric contacts. The predefined structures may have dimensions as small as about 50 μm. The predefined structures may be fabricated by applying suitable structuring techniques to an initially homogenous metal layer. Such structuring techniques may, for example, comprise wet chemical and/or optical means and/or a Damascene process. These structuring processes may lead to higher design-flexibility.

Figure 3:
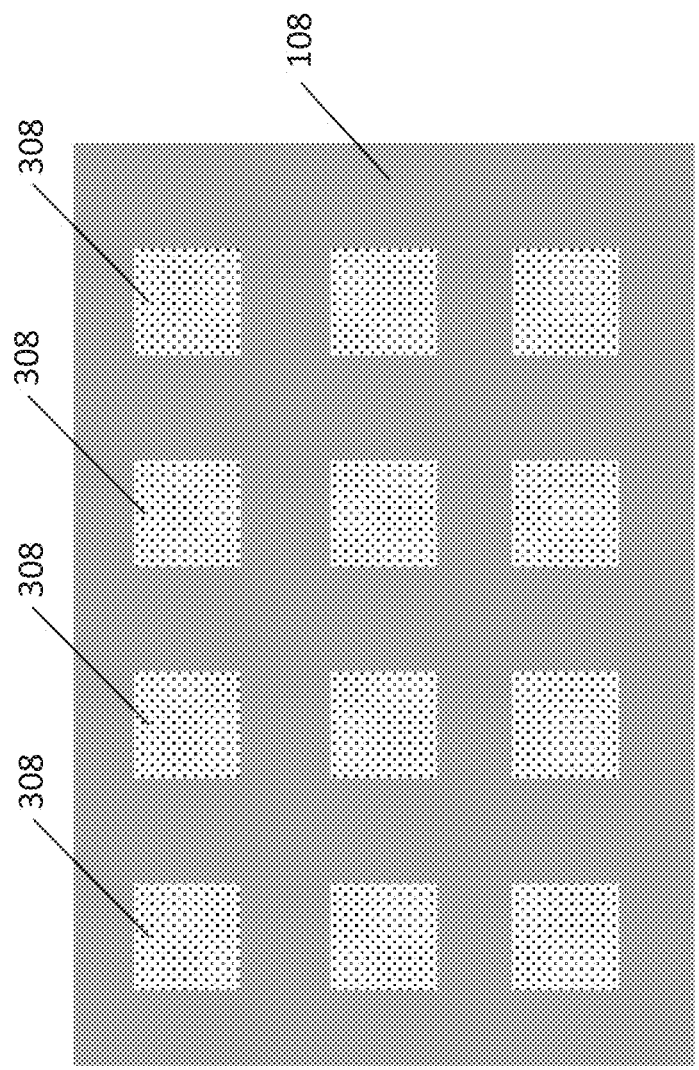
FIG. 3 depicts a plan view of an embodiment of an electronic element wherein the metal layer is arranged in predefined structures.

FIG. 3 shows a top-down plan view of an embodiment of an electronic element 108 comprising a porous metal layer 308. The porous metal layer 308 may comprise predefined structures. The predefined structures of the porous metal layer 308 need not be symmetrical as depicted in FIG. 3, but may have any shape appropriate for a particular embodiment.

Figure 4:
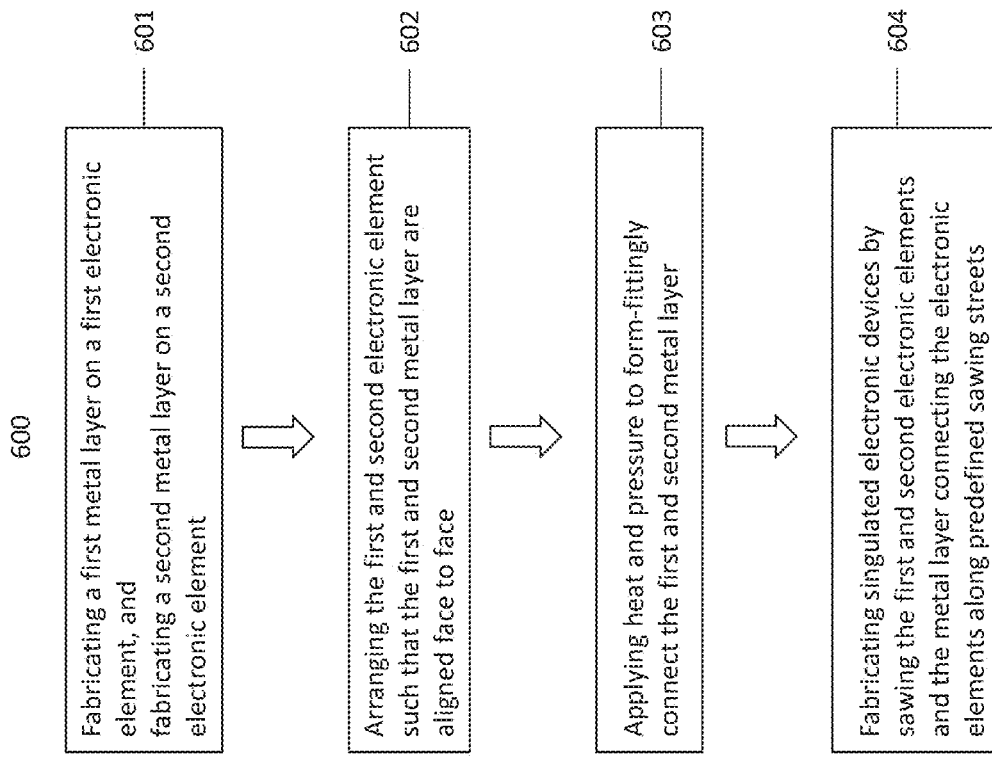
FIG. 4 depicts a flow chart of an embodiment method for fabricating an electronic device.

FIG. 4 shows a flow chart of an embodiment of a method 600 for fabricating an electronic device is depicted. A first step 601 comprises fabricating a first porous metal layer on a first electronic element and a second porous metal layer on a second electronic element. A second step 602 comprises arranging the first and second electronic elements such that the first and second metal layers are aligned face to face. A third step 603 comprises applying heat and pressure to the first and second electronic elements to form-fittingly connect the first and second metal layers. A fourth step 604 comprises separating the first electronic element, the second electronic element, and the metal layer connecting the first and second electronic element along predefined sawing streets for fabricating singulated electronic devices.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for fabricating an electronic device, the method comprising:
    fabricating a first porous metal layer on a main surface of a first electronic element;
    fabricating a second porous metal layer on a main surface of a second electronic element, wherein the first and second porous metal layers comprise single element copper;
    arranging the first electronic element and the second electronic element such that the first porous metal layer and the second porous metal layer are aligned face to face; and
    applying heat and pressure such that both porous metal layers are directly form-fittingly connected, wherein the heat is in a range of 100° C. to 400° C., and the pressure is in a range of 2 MPa to 300 MPa.

2. The method of claim 1, wherein
the first porous metal layer and the second porous metal layer are fabricated using cold plasma assisted deposition of microparticles.

3. The method of claim 1, wherein
the first electronic element comprises a semiconductor device and the second electronic element comprises a copper block.

4. The method of claim 1, wherein
the first porous metal layer and the second porous metal layer are devoid of any alloy.

5. The method of claim 1, wherein
fabrication of the first porous metal layer and the second porous metal layer is performed without using flux melting agent.

* * * * *